United States Patent
Sasaki

(10) Patent No.: US 7,336,070 B2
(45) Date of Patent: Feb. 26, 2008

(54) BRIDGE CIRCUITED MAGNETIC SENSOR HAVING MAGNETO-RESISTIVE ELEMENT AND FIXED RESISTOR WITH THE SAME LAYER CONFIGURATION

(75) Inventor: Yoshito Sasaki, Niigata-ken (JP)

(73) Assignee: Alps Electric Co., Inc., Tokyo (JP)

( * ) Notice: Subject to any disclaimer, the term of this patent is extended or adjusted under 35 U.S.C. 154(b) by 0 days.

(21) Appl. No.: 11/684,948

(22) Filed: Mar. 12, 2007

(65) Prior Publication Data

US 2007/0210791 A1 Sep. 13, 2007

(30) Foreign Application Priority Data

Mar. 13, 2006 (JP) .............................. 2006-067737

(51) Int. Cl.
*G01B 7/30* (2006.01)
*H01L 43/08* (2006.01)

(52) U.S. Cl. ............ 324/207.21; 324/252; 324/207.25; 324/249; 360/314; 360/324

(58) Field of Classification Search ............ 324/207.21, 324/207.25, 249, 252; 360/324–327, 313–315

See application file for complete search history.

(56) References Cited

U.S. PATENT DOCUMENTS 6,452,382 B1* 9/2002 Tokunaga et al. ...... 324/207.21
7,210,236 B2* 5/2007 Sato et al. ..................... 33/356

FOREIGN PATENT DOCUMENTS

JP 2006-066127 3/2003

* cited by examiner

*Primary Examiner*—Bot LeDynh
(74) *Attorney, Agent, or Firm*—Brinks Hofer Gilson & Lione

(57) ABSTRACT

The application provides a magnetic sensor which can suppress an irregularity of a central potential due to a change in a temperature, decrease size of the sensor, and lower the manufacturing cost of the sensor. A magneto-resistive element and fixed resister are provided on an element base and have the same configuration elements. A second magnetic layer and non-magnetic layer in the fixed resistor are reversely laminated on each other in a manner different from the magneto-resistive element, and the second magnetic layer is formed in contact with the first magnetic layer, thereby fixing the magnetization directions of the first magnetic layer and the second magnetic layer in the same direction. In this manner, the irregularity of the temperature coefficient between the magneto-resistive element and the fixed resistor is suppressed, and the irregularity of the central potential due to the change in the temperature is suppressed.

5 Claims, 8 Drawing Sheets

BRIDGE CIRCUITED MAGNETIC SENSOR HAVING MAGNETO-RESISTIVE ELEMENT AND FIXED RESISTOR WITH THE SAME LAYER CONFIGURATION

This application claims the benefit of priority under 35 U.S.C. § 119 to Japanese Patent Application No. 2006-067737, filed Mar. 13, 2006, which is hereby incorporated by reference in its entirety.

BACKGROUND OF THE INVENTION

1. Field of the Invention

The application relates to a non-contact magnetic sensor for detecting the open and closed states of a foldable cellular phone, and more particularly, to a magnetic sensor which can suppress irregularity of a central potential due to a change in a temperature, thus decreasing the size and manufacturing cost of the sensor.

2. Description of the Related Art

A method of assembling a magnetic sensor is disclosed in JP-A-2003-066127. According to JP-A-2003-066127, a plurality of magneto-resistive elements are formed on the same substrate. The fixed layers (pinned layer) of all the magneto-resistive elements are magnetized in the same direction, and the substrate is cut out into a plurality of element bases. A combination of the magnetization directions of the fixed layers of the magneto-resistive elements is set with respect to the cut-out element bases, thereby assembling a plurality of element bases together (for example, claim 1 of JP-A-2003-066127).

FIG. 14 is a partial top plan view of the known magnetic sensor. As shown in FIG. 14, the magneto-resistive elements 63 and 64 are provided on the element bases 61 and 62, respectively.

Terminal sections 63a and 64a are provided at both ends of the magneto-resistive elements 63 and 64 in the length directions thereof and each of the terminal sections 63a and 64a is electrically connected to a terminal section 66 on a circuit board 65 by wire bonding, for example.

In the magnetic sensor, for example in order to detect a change in a central potential, the fixed layers in the magneto-resistive elements 63 and 64 are magnetized in directions opposite to each other, as shown in FIG. 14.

The magnetic sensor shown in FIG. 14 is used for detecting the open and closed states of a mobile phone, for example. That is, a magnet is provided on a first member (for example, a member in which a display screen is mounted) of the mobile phone and the magnetic sensor shown in FIG. 14 is incorporated in a second member (for example, an operation member). The magnitude of an exterior magnetic field from the magnet influencing on the magneto-resistive elements 63 and 64 varies between the open and closed states of the mobile phone. Specifically, when the mobile phone gets opened from the closed state, the magnitude of the exterior magnetic field from the magnet influencing the magneto-resistive elements 63 and 64 gradually decreases. In this case, since the resistance values of the magneto-resistive elements 63 and 64 are changed in accordance with a relation between the magnetization directions of the fixed layer and the free layer, the magnetization direction of which varies with the influence of the exterior magnetic field, it is possible to detect the open and closed states of the mobile phone from the change in an output voltage based on the change in the resistance value.

Since the magneto-resistive elements 63 and 64 of which the magnetization directions of the fixed layers are different from each other are used in the known magnetic sensor shown in FIG. 14, it is impossible to form the two magneto-resistive elements 63 and 64 on the same element base. As disclosed in JP-A-2003-066127, the element bases 61 and 62 are cut, and then it is required to match the directions such that the magnetization directions of the fixed layers in the magneto-resistive elements 63 and 64 are opposite with each other.

However, it is considerably difficult to match the directions of the element bases 61 and 62 with high precision, the difficulty has a tendency to bring a fluctuation to the magnetization direction of the fixed layers. This causes irregular detection in the operation of detecting the open and closed states.

Additionally, a combination of a plurality of element bases, as depicted in FIG. 14, makes the magnetic sensor too large. As the number of bonding positions between the terminal sections 63a and 64a of the magneto-resistive elements 63 and 64 and terminal section 66 of the circuit board 65 increases, the manufacturing cost increases accordingly.

Meanwhile, when a bridge circuit is configured by combining the magneto-resistive element with the fixed resistor, for example, the magneto-resistive element and the fixed resistor can be formed on the same element base, thereby solving the above problems.

However, since the materials of the magneto-resistive element and the fixed resistor are different from each other, temperature coefficients of resistance (TCR) thereof are different from each other. As a result, as the temperature varies, a central voltage becomes unbalanced and the detection precision is lowered, thereby causing false operation.

SUMMARY OF THE INVENTION

The application is made to solve the above problems. It is an object of the application to provide a magnetic sensor which can suppress irregularity of a central potential due to a change in a temperature, and decrease the size and manufacturing cost of the magnetic sensor.

According to an aspect of the application, a magnetic sensor includes at least one magneto-resistive element and at least one fixed resistor, where the magneto-resistive element and the fixed resistor all have an antiferromagnetic layer, a plurality of magnetic layers, a non-magnetic layer, and a protection layer serving as the uppermost layer. The magneto-resistive element constitutes a fixed layer having at least the one magnetic layer with a fixed magnetization direction, a magneto-sensitive layer having the other magnetic layers with the magnetization directions variable by an exterior magnetic field, where the non-magnetic layer is interposed between the fixed layers and the magneto-sensitive layer, and the antiferromagnetic layer is formed in contact with a surface opposite to the surface in which the non-magnetic of the fixed layer is formed. In the fixed resistor, at least one magnetic layer is formed in contact with the antiferromagnetic layer and the magnetization directions of all the magnetic layers are fixed.

As described above, in the above-mentioned aspect of the application, the antiferromagnetic layer, the plurality of magnetic layers, the non-magnetic layer, and the protection layer are used as a constituent layer of the magneto-resistive element and the fixed resistor. By changing the order of laminating the constituent layer of the magneto-resistive element and the fixed resistor, the magneto-resistive element serves as a variable resistor in which the magnetoresistance effect is properly exhibited on the basis of a change in the exterior magnetic field, thereby changing the resistance value. On the other hand, since the magnetization directions of all the magnetic layers are fixed in a regular direction, the magnetoresistance effect in the fixed resistor is not exhibited even with the change in the exterior magnetic field in a manner different from the magneto-resistive element.

As described above, according to the application, since the magneto-resistive element and the fixed resistor all have the antiferromagnetic layer, the plurality of magnetic layers, the non-magnetic layer, and the protection layer, it is possible to suppress the irregularity of the temperature coefficients in the magneto-resistive element and the fixed resistor, compared with the case of the known magnetic sensor. Accordingly, it is possible to operate the magnetic sensor in a stable manner even with the change in the temperature.

In the above-mentioned aspect of the application, it is desirable that a first magnetic layer corresponding to the fixed layer, and a second magnetic layer corresponding to a free layer are laminated on the fixed resistor, and the antiferromagnetic layer is formed in contact with the laminated magnetic layers to fix the magnetization directions of the laminated magnetic layers in one direction. Specifically, it is desirable that the first magnetic layer is formed in contact with the antiferromagnetic layer, and the second magnetic layer and the non-magnetic layer are reversely laminated on each other in a manner different from the magneto-resistive element and the second magnetic layer is formed in contact with a surface opposite to the surface where the antiferromagnetic layer of the first magnetic layer is formed, thereby fixing the magnetization direction of the second magnetic layer to the same direction as the first magnetic layer.

In this manner, it is possible to fix the magnetization directions of all the magnetic layers with a simple configuration.

In the above-mentioned aspect of the application, it is desirable that the magneto-resistive element and the fixed resistor are formed on the same element base. In this manner, it is possible to further downsize the magnetic sensor and decrease the number of bonding and the like, thereby decreasing the manufacturing cost.

In the above-mentioned aspect of the application, it is desirable that the magneto-resistive element and the fixed resistor have the same layer configuration. For example, besides the antiferromagnetic layer, the fixed layer, the non-magnetic layer, magneto-sensitive layer, and the protection layer, a seed layer for improving crystallinity may be provided in the magneto-resistive element. When the seed layer is also provided in the fixed resistor, by forming the magneto-resistive element with the same constituent layers as that of the fixed resistor, the irregularity of the temperature coefficients in the magneto-resistive element and the fixed resistor may be more effectively lowered (or most preferably, the temperature coefficients may become equal to each other). Accordingly, it is possible to obtain a magnetic sensor capable of stably operating even with the change in the temperature.

According to the magnetic sensor of the above-mentioned aspect of the application, it is possible to suppress the irregularity of the central potential level even with the change in the temperature and decrease the size and manufacturing cost of the magnetic sensor.

DESCRIPTION OF THE PREFERRED INVENTION

Figure 1:
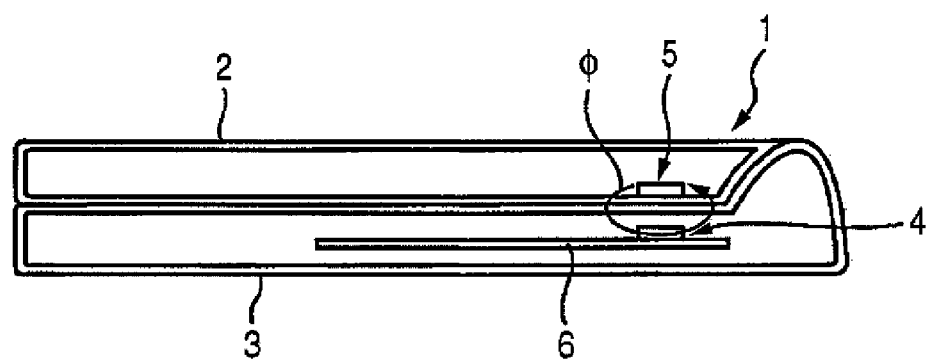
FIG. 1 is a partially schematic diagram showing a foldable cellular phone with a built-in magnetic sensor according to an embodiment of the application (closed state).
Figure 2:
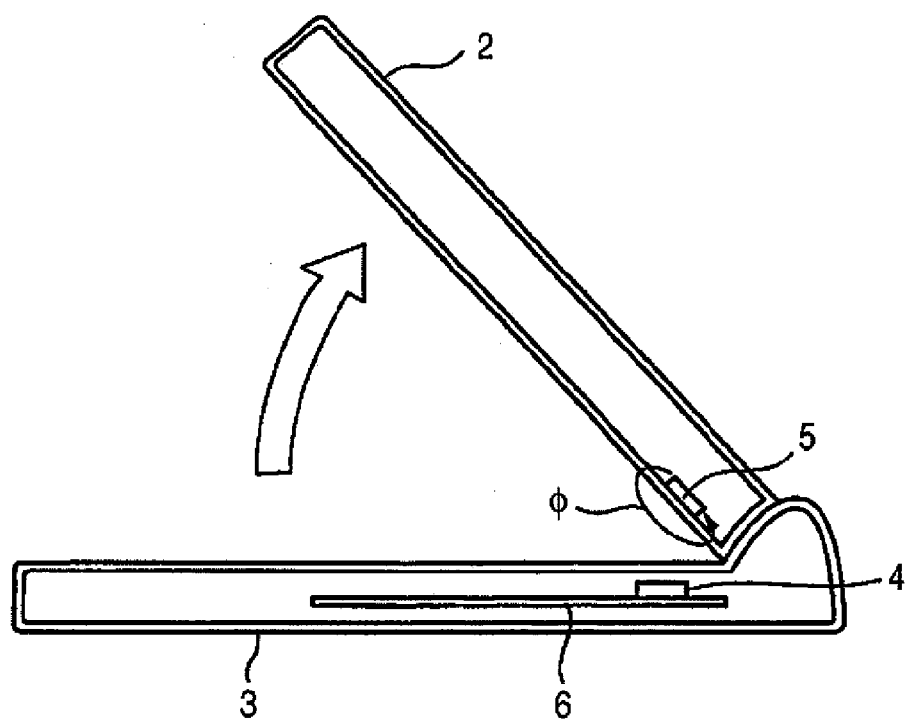
FIG. 2 is a partially schematic diagram showing a foldable cellular phone with a built-in magnetic sensor according to the embodiment of the application (open state).
Figure 3:
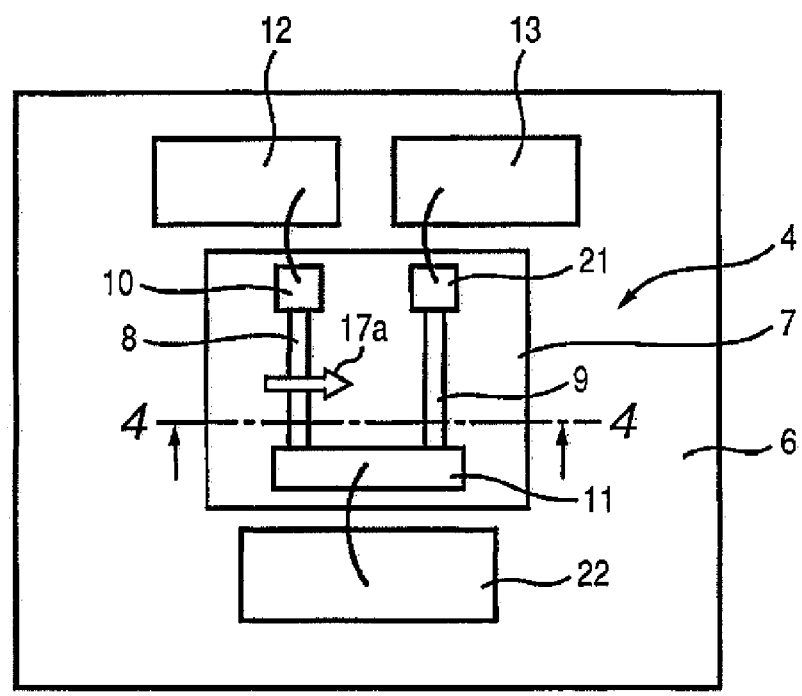
FIG. 3 is a partial top plan view of the magnetic sensor according to an embodiment of the application.
Figure 4:
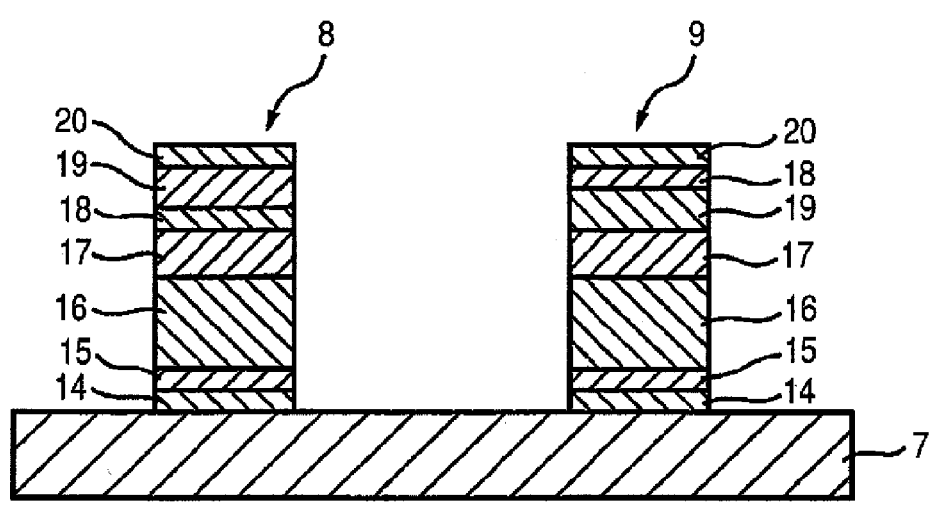
FIG. 4 is a partial top plan view of the magnetic sensor taken along a line A-A of FIG. 3.
Figure 5:
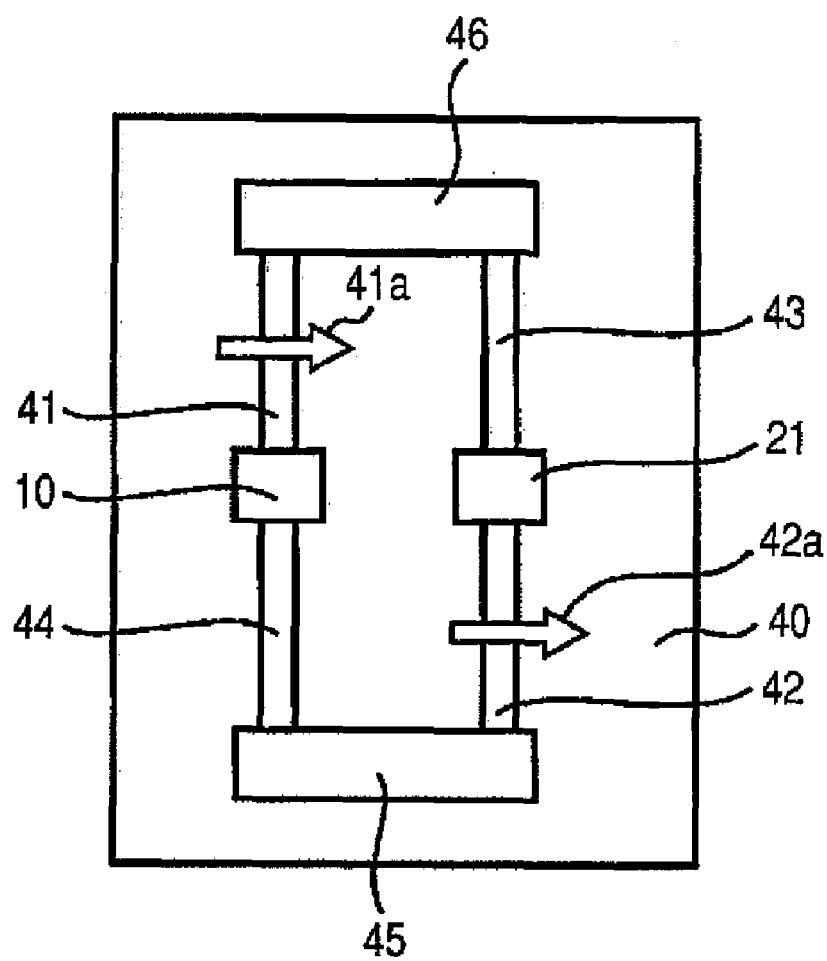
FIG. 5 is a partial top plan view of the magnetic sensor with a structure different from that shown in FIG. 3 according to an embodiment of the application.
Figure 6:
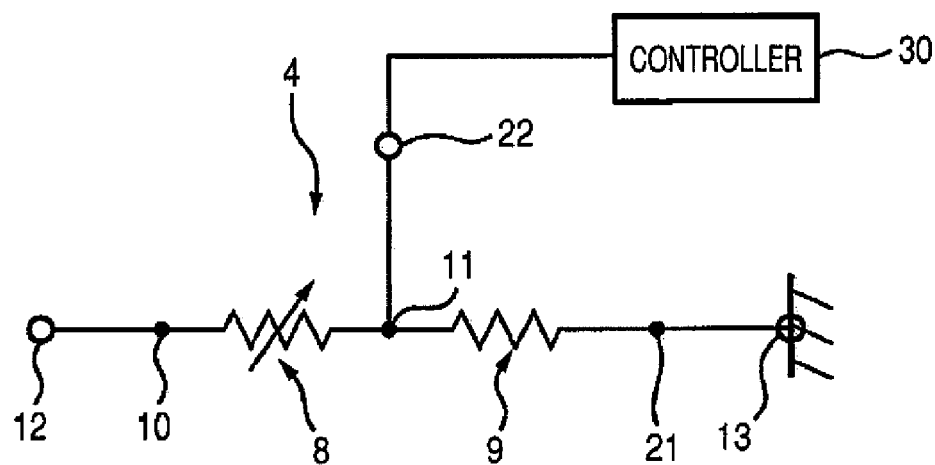
FIG. 6 is a diagram illustrating a circuit configuration of the magnetic sensor shown in FIG. 3.
Figure 7:
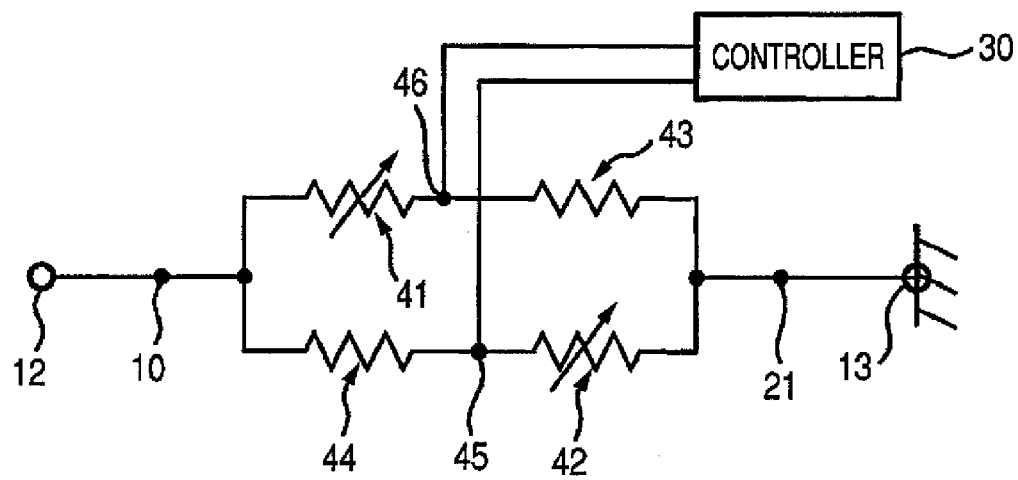
FIG. 7 is a diagram illustrating a circuit configuration of the magnetic sensor shown in FIG. 5.

FIGS. 1 and 2 are partial schematic diagrams showing a foldable cellular phone with a built-in a magnetic sensor according to an embodiment of the application. FIG. 3 is a partial top plan view of the magnetic sensor according to an embodiment of the application. FIG. 4 is a partial top plan view of the magnetic sensor taken along a line A-A of FIG. 3. FIG. 5 is a partial top plan view of the magnetic sensor with a structure different from that shown in FIG. 3 according to an embodiment of the application. FIG. 6 is a diagram illustrating a circuit configuration of the magnetic sensor shown in FIG. 3. FIG. 7 is a diagram illustrating a circuit configuration of the magnetic sensor shown in FIG. 5.

As shown in FIG. 1, a foldable cellular phone 1 has a first member 2 and a second member 3. The first member 2 is formed in a screen display and the second member 3 is formed in an operation body. A liquid crystal display a receiver, and the like are provided on a surface of the first member 2 opposite to the second member 3. Buttons, a microphone, and the like are provided on a surface of the second member 3 opposite to the first member 2. As shown in FIG. 1, the foldable cellular phone 1 is in a closed state. As shown in FIG. 1, a magnet 5 is incorporated in the first member 2, and a magnetic sensor 5 is incorporated in the second member 3. When the foldable cellular phone 1 is in the closed state as shown in FIG. 1, the magnet 5 and the magnetic sensor 4 are disposed in locations in which the magnet 5 and the magnetic sensor 4 are opposite to each other (in a perpendicular direction with respect to the formation surface of the magnet 5 and the magnetic sensor 5).

As shown in FIG. 1, an external magnetic field φ exerting from the magnet 5 is applied to the magnetic sensor 4, and then the external magnetic field φ is detected by the magnetic sensor 4. In this manner, the closed state of the foldable cellular phone 1 is detected.

On the other hand, when the foldable cellular phone is opened as shown in FIG. 2, the magnitude of the exterior magnetic field φ applied to the magnetic sensor 4 gradually decreases as the first member 2 is separated from the second member 3, and finally becomes zero. When the magnitude of the exterior magnetic field φ applied to the magnetic sensor 4 becomes zero or decreases to a predetermined magnitude or less, the open state of the foldable cellular phone 1 is detected. Then, a controller incorporated in the foldable cellular phone 1 controls a back light on a back side of the liquid crystal display or the operation button, for example, to emit light.

As shown in FIG. 3, the magnetic sensor 4 according to the embodiment is mounted on a circuit board 6 incorporated in the second member 3. One magneto-resistive element 8 and one fixed resistor 9 are provided on an element base 7 of the magnetic sensor 4. As shown in FIG. 3, terminal sections 10 and 11 are provided on both sides of the magneto-resistive element 8 in a length direction thereof. For example, the terminal section 10 is electrically connected to an input terminal (power supply Vcc) 12 provided on the substrate 6 by a wire-bonding, a die-bonding, and the like (see FIG. 6). The terminal section 11 serves as a common terminal shared by the fixed resistor 9 and is electrically connected to an output terminal 22 on the substrate 6 by the wire-bonding, the die-bonding, and the like (see FIG. 6).

As shown in FIG. 3, the above-described terminal section 11 and a terminal section 21 are provided on both sides of the fixed resistor 9 in the length direction. The terminal section 21 is electrically connected to an earth terminal 13 on the circuit board 6 by the wire-bonding, the die-bonding, and the like (see FIG. 6).

As shown in FIG. 3, the magneto-resistive element 8 and the fixed resistor 9 are all formed in an elongated linear shape, but may be formed in a meandering shape (S shape) and the like, for example.

As shown in FIG. 4, the magneto-resistive element 8 is sequentially laminated on an underlying layer 14, a seed layer 15, an antiferromagnetic layer 16, a fixed layer (a first magnetic layer) 17, a non-magnetic layer 18, a free layer (a magneto-sensitive layer, a second magnetic layer) 19, and a protection layer 20, in this order from a bottom surface. The underlying layer 14, for example, is formed of a non-magnetic material such as at least one atom selected from Ta, Hf, Nb, Zr, Ti, Mo$_5$ or W. The seed layer 15 is formed of NiFeCr, Cr, or the like. The antiferromagnetic layer 16 is formed of an antiferromagnetic material containing an atom α (where α is at least one atom of Pt, Pd, Ir, Rh, Ru, or Os) and Mn or that containing atoms α, α' (where α' is at least one atom selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, or a rare earth atom) and Mn. For example, the antiferromagnetic layer 16 is formed of IrMn or PtMn. The fixed layer 17 and the free layer 19 are formed of magnetic materials such as a CoFe alloy, a NiFe alloy, a CoFeNi alloy, and the like. The non-magnetic layer 18 is formed of Cu or the like. The protection layer 20 is formed of Ta or the like.

Since the antiferromagnetic layer 16 and the fixed layer 17 in the magneto-resistive element 8 are formed in contact, an exchange coupling magnetic field (Hex) occurs in an interface between the antiferromagnetic layer 16 and the fixed layer 17 after a heat treatment process in a magnetic field, and thus a magnetization direction of the fixed layer 17 is fixed in one direction. A magnetization direction 17a of the fixed layer 17 is shown as an arrow in FIG. 3. The magnetization direction 17a is perpendicular to the length direction (a width direction of the element). On the other hand, the free layer 19 is opposing the fixed layer 17 via the non-magnetic layer 18, and the magnetization direction of the free layer 19 is not fixed in one direction. That is, the magnetization of the free layer 19 changes in accordance with the external magnetic field.

As shown in FIG. 4, the fixed resistor 9 is sequentially formed of the underlying layer 14, the seed layer 15, the antiferromagnetic layer 16, the first magnetic layer 17, the second magnetic layer 19, the non-magnetic layer 18, and the protection layer 20 in this order from a bottom surface. The first magnetic layer 17 and the second magnetic layer 19 in the fixed resistor 9 correspond to the fixed layer 17 and the free layer 19 in the magneto-resistive element 8, respectively. That is, an order of laminating the non-magnetic layer 18 and the free layer 19 in the magneto-resistive element 8 is changed each other in the fixed resistor 9. Materials of each common layer in the magnetoresistance 8 and the fixed resistor 9 are equal. For example, when the magneto-resistive element 8 is sequentially formed of the underlying layer 14 (Ta), the seed layer 15 (NiFeCr), the antiferromagnetic layer 16 (IrMn), the fixed layer 17 (CoFe), the non-magnetic layer 18 (Cu), the free layer 19 (NiFe), and the protection layer 20 (Ta) from the bottom surface, the fixed resistor 9, for example, is sequentially formed of the underlying layer 14 (Ta), the seed layer 15 (NiFeCr), the antiferromagnetic layer 16 (IrMa), the first magnetic layer 17 (CoFe), the second magnetic layer 19 (NiFe), the non-magnetic layer 18 (Cu), and the protection layer 20 (Ta) from the bottom surface. According to the embodiment shown in FIG. 4, the first magnetic layer 17 and the second layer 19 in the fixed resistor 9 are formed so as to be in contact. The antiferromagnetic layer 16 is formed in contact with the first magnetic layer 17 or the second magnetic layer 19. The antiferromagnetic layer 16, the first magnetic layer 17, and the second magnetic layer 19 are sequentially laminated in FIG. 4. Accordingly, when the heat treatment in a magnetic field is performed, the exchange coupling magnetic field (Hex) occurs in an interface between the antiferromagnetic layer 16 and the first magnetic layer 17 to fix the magnetization of the first magnetic layer 17 in one direction. However, the magnetization of the second magnetic layer 19 formed in contact with the first magnetic layer 17 is also fixed in the same direction as the magnetization direction of the first magnetic layer 17 due to an antiferromagnetic coupling which occurs between the second magnetic layer 19 and the first magnetic layer 17. The magnetization direction of the first magnetic layer 17 and the second magnetic layer 19 can be either equal or different from the magnetization direction 17a of the fixed layer 17 in the magneto-resistive element 8. However, since it is easier to control the magnetic field during the manufacturing process, it is preferable that the magnetization direction of the first magnetic layer 17 and the second magnetic layer 19 is the same as the magnetization direction 17a of the fixed layer 17. In the embodiment, the important point is that the magnetization direction of the first magnetic layer 17 and the second magnetic layer 19 is fixed. Accordingly, it is not necessary to sequentially laminate the antiferromagnetic layer 16, the first magnetic layer 17, and the second magnetic layer 19, but it is possible to sequentially laminate the first magnetic layer 17, the antiferromagnetic layer 16, the second magnetic layer 19, and the non-magnetic layer 18, and the like. However, as shown in FIG. 4, the order of laminating the second magnetic layer 19 and the non-magnetic layer 18 is changed in a manner different from the magneto-resistive element 8. In this manner, it is not necessary to change the order of laminating the magneto-resistive element 8. As a result, the magnetization direction of the magnetic layers 17 and 19 can be simply fixed, thereby making the manufacturing method simple.

As shown in FIGS. 3 and 6, for example, 5 V is applied from the input terminal (power supply Vcc), and then an output value (central potential) from the magnetic sensor 4 nearly becomes 2.5 V at a state with no-magnetic field according to the embodiment shown in FIG. 4. The exterior magnetic field $\phi$ from the magnet 5 has an effect on the magneto-resistive element 8, and the magnitude variation changes a magnetization relation (magnetization state) between the free layer 19 and the fixed layer 17, thereby changing the resistance value of the magneto-resistive element 8 (which is called a magnetoresistance). However, the resistance value of the magneto-resistive element 9 is not changed in accordance with the exterior magnetic field $\phi$. The output value from the magnetic sensor 4 is changed, and then the output value is compared to the threshold voltage in a controller 30. For example, when the output value is higher than the threshold voltage, an output signal is switched on. The foldable cellular phone 1 is open, and thus a operation of the back light is conducted. On the other hand, when the output value is lower than the threshold, the switch turns off, for example, the switching signal is not output. The foldable cellular phone 1 is closed, the operation of the back light and the like stops.

According to the embodiment, the magneto-resistive element 8 and the fixed resistor 9 have all the antiferromagnetic layer 16, the first magnetic layer 17, the non-magnetic layer 18, the second magnetic layer 19, and the protection layer 20 described above. The second magnetic layer 19 in the magneto-resistive element 8 serves as a free layer in which the magnetization direction is changed in accordance with variation of the exteriormagnetic field. The second magnetic layer 19 in the fixed resistor 9 is formed in contact with the first magnetic layer 17, and thus the magnetization direction of the second magnetic layer 19 and the first magnetic layer 17 is fixed.

The magneto-resistive element 8 serves as a variable resistor in which the magnetoresistance effect is influenced to change the resistance value in accordance with a change of the exterior magnetic field. On the other hand, as for the fixed resistor 9, the magnetoresistance effect is not influenced in accordance with the change of the exterior magnetic field and the resistance value is constant. Since the magneto-resistive element 8 and the fixed resistor 9 have all the antiferromagnetic layer 16, the first magnetic layer 17, the non-magnetic layer 18, the second magnetic layer 19, and the protection layer 20, an irregularity of the temperature coefficient of resistances (TCR) of the magneto-resistive element 8 and the fixed resistor 9 can be suppressed. As a result, an irregularity of the central potential with respect to a temperature change can be also suppressed, thereby realizing the magnetic sensor 4 to be stably operated.

In particular, according to the embodiment shown in FIG. 4, the constituent layers of the magneto-resistive element 8 completely accord with those of the fixed resistor 9. That is, since the underlying layer 14 and the seed layer 15 used in the magneto-resistive element 8 as well as the antiferromagnetic layer 16, the first magnetic layer 17, the non-magnetic layer 18, the second magnetic layer 19, and the protection layer 20 are also used in the fixed resistor 9, the irregularity of the temperature coefficient and the resistance value (state with non-magnetic field) of the magneto-resistive element 8 and the fixed resistor 9 can be more properly suppressed. Accordingly, the magnetic sensor 4 can be operated in a stable manner. In order to approximate the temperature coefficient of the fixed resistor 9 to the resistance value, it is required that the film thickness of each common layer in the magneto-resistive element 8 and the fixed resistor 9 is made equal. Additionally, the fixed layer 17 in the magneto-resistive element 8, for example, can be a laminated ferri-structure in which a nonmagnetic intermediate layer is interposed between two magnetic layers. As the first magnetic layer 17, the two magnetic layers and the non-magnetic intermediate layer are provided in the fixed resistor 9. In this case, the first magnetic layer 17 and the fixed layer 17 may not be the same laminated ferri-structure. What is important is that the fixed resistor 9 has the same laminated ferri-structure and same configuration elements and the magnetic layers are all fixed. For example, when the laminated ferri-structure includes the magnetic layer (CoFe), the non-magnetic intermediate layer (Ru), and the magnetic layer (CoFe), the fixed resistor 9 may be sequentially laminated of the magnetic layer (CoFe), the magnetic layer (CoFe), and the non-magnetic layer (Ru). For example, when all magnetic layers are sequentially formed on the antiferromagnetic layer 16 and the other non-magnetic layer is formed on the magnetic layer in the fixed resistor 9, the magnetization direction of all magnetic layers is simply fixed. For example, when the magneto-resistive element 8 is formed such that the antiferromagnetic layer 16 (IrMn), the fixed layers 17 (CoFe, Ru, and CoFe), the non-magnetic layer 18 (Cu), and the free layers 19 (CoFe and NiFe) are sequentially laminated, the fixed resistor 9, for example, is formed such that IrMn, CoFe, CoFe, CoFe, NiFe, Ru, and Cu can be laminated. As a result, all magnetic direction of CoFe, CoFe, CoFe, and NiFe, which are a plurality of magnetic layers, can be properly fixed.

Additionally, as shown in FIGS. 3 and 4, the magneto-resistive element 8 and the fixed resistor 9 provided to the magnetic sensor 4 are mounted on the element base 7. Accordingly, the size of the magnetic sensor 4 can be decreased. By forming the magneto-resistive element 8 and the fixed resistor 9 on the same element base 7, the terminal section 11 provided on edges of magneto-resistive element 8 and the fixed resistor 9 can serves as a common terminal. Accordingly, the number of bonding between the magnetic sensor 4 and the circuit board 6 can decrease, thereby lowering the manufacturing cost, in contrast to when the magneto-resistive element 8 and the fixed resistor 9 each are mounted on different element bases, Further, since the magneto-resistive element 8 and the fixed resistor 9 are formed on the same element base 7, the magnetization-controlling process of the magneto-resistive element 8 and the fixed resistor 9 can be easily performed.

According to the embodiment, even when the magneto-resistive element 8 and the fixed resistor 9 each are mounted on the different element bases, the irregularity of the temperature coefficient of the magneto-resistive element 8 and the fixed resistor 9 can be suppressed. On the other hand, a precision of a high-location determination is not required and an irregularity of the detection precision can be suppressed rather than when the magneto-resistive element is formed on the same element base in the related art. However, it is preferable that the magneto-resistive element 8 and the fixed resistor 9 are formed on the same element base 7 in terms of a decrease in size of the magnetic sensor 4.

According to the embodiment shown in FIGS. 3 and 4, a bridge circuit a bridge circuit) provided with each of the magneto-resistive element 8 and the fixed resistor 9 on the element base 7 is configured. However, as shown in FIGS. 5 and 7, a bridge circuit (full-bridge circuit) provided with two magneto-resistive elements 41 and 42 and two fixed resistors 43 and 44 on the element base 40 can be configured. As shown in FIG. 5, magnetization directions 41a and 42a of the fixed layers in the magneto-resistive elements 41 and 42 can be equal. Additionally, as shown in FIG. 5, the magneto-resistive element 41 and the fixed resistor 43 can be connected to a common terminal (first output terminal) 46 and the magneto-resistive element 42 and the fixed resistor 44 can be connected to a common terminal (second output terminal) 45.

As shown in FIGS. 5 and 7, by configuring the full-bridge circuit, the output can increase, thereby realizing a more stable magnetic sensor 4.

A method of manufacturing the magnetic sensor 4 shown in FIG. 4 will be described below. FIGS. 8 to 13 are process diagrams illustrating the method of manufacturing the magnetic sensor 4 shown in FIG. 4, each of which corresponds to a partial sectional view of processes performed during the manufacturing process.

Figure 8:
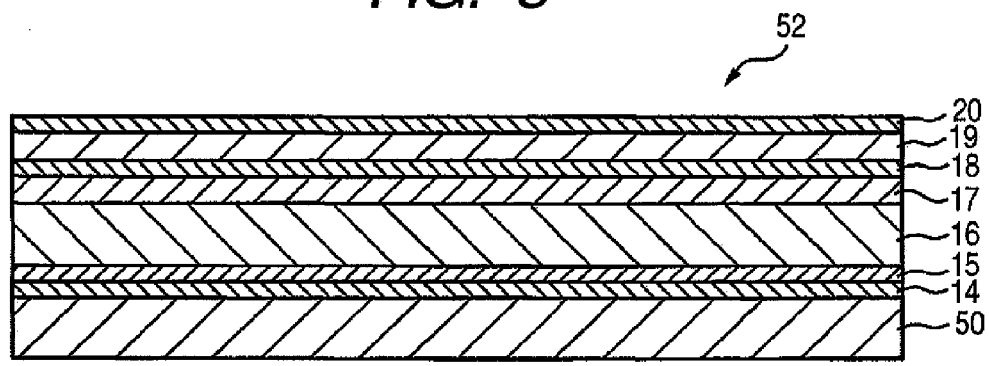
FIG. 8 is a process diagram illustrating a method of manufacturing the magnetic sensor according to an embodiment of the application.

In a process represented in FIG. 8, a laminated body 52 is sequentially formed of the underlying layer 14, the antiferromagnetic layer 16, the fixed layer (first magnetic layer) 17, the non-magnetic layer 8, the free layer (second magnetic layer) 19, and the protection layer 20 from bottom on an entire substrate 50. The materials of each layer are described above.

Figure 9:
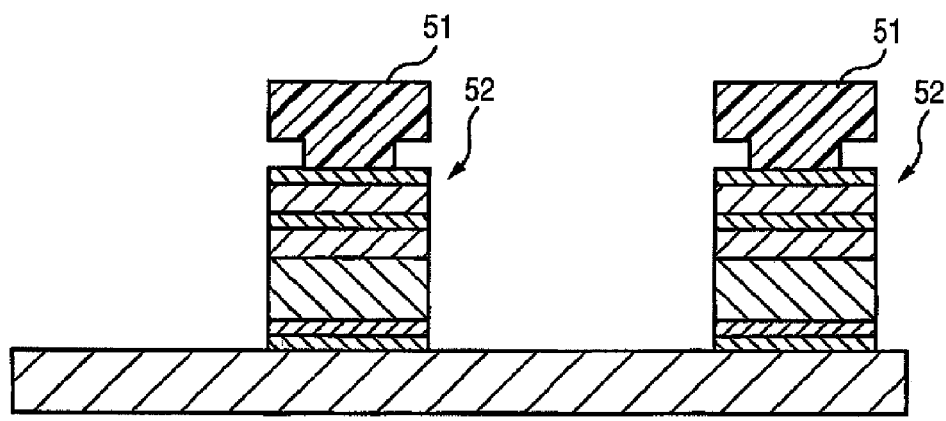
FIG. 9 is a process diagram illustrating processes performed after the processes illustrated in FIG. 8.

Next, in a process represented in FIG. 9, as the protection layer 20, a lift-offresist layer 51 is provided on the part which will become the magneto-resistive element 8. A width and length of the lift-off resist layer 51 are made longer than those of the magneto-resistive element 8. Apart of the laminated body 52 without covering of the lift-offresist layer 51 is removed by the ion milling process and the like.

Figure 10:
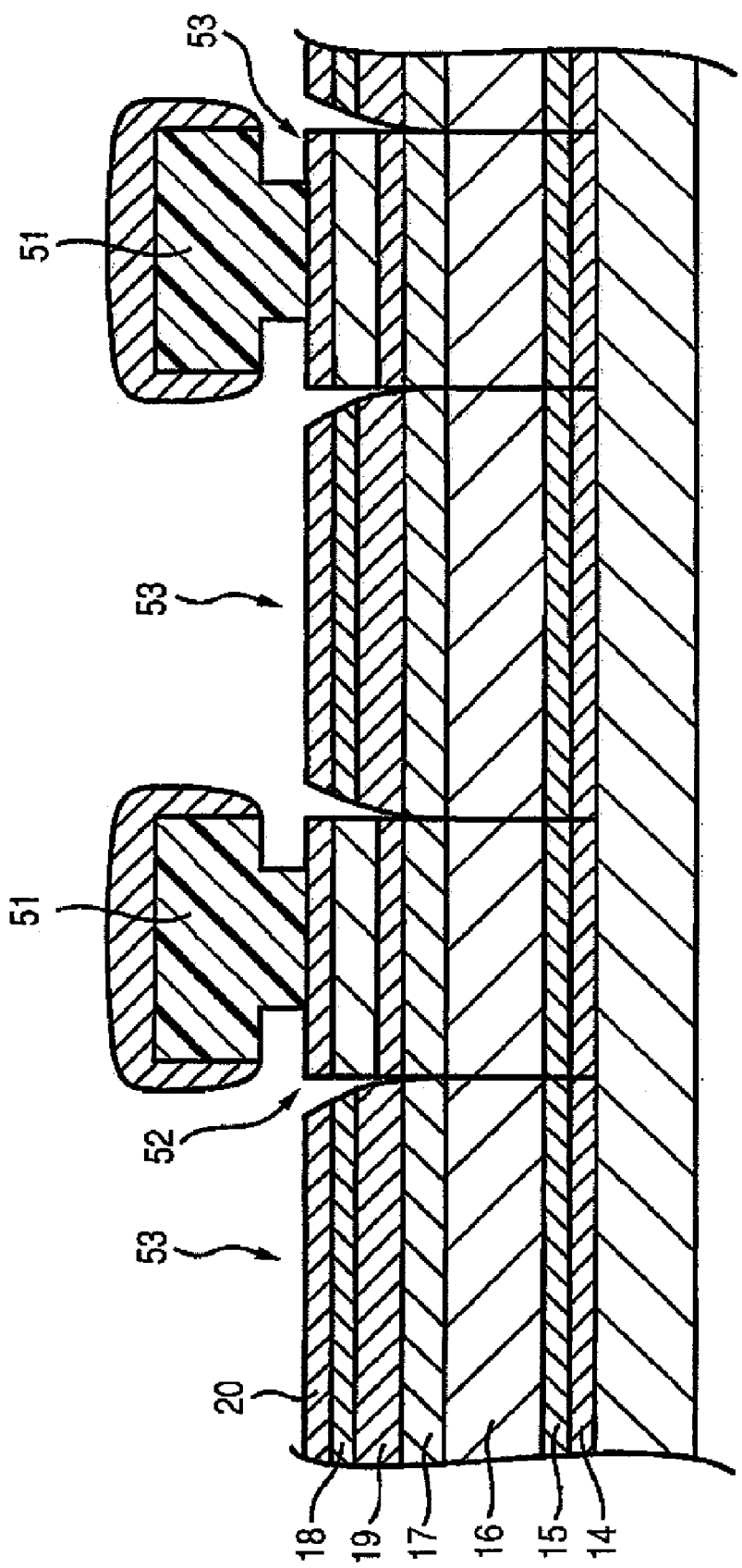
FIG. 10 is a process diagram illustrating processes performed after the processes illustrated in FIG. 9.

Next, in a process represented in FIG. 10, a laminated body 53 is sequentially formed of the underlying layer 14, the seed layer 15, the antiferromagnetic layer 16, the fixed layer (first magnetic layer) 17, the second magnetic layer 19, the non-magnetic layer 8, and the protection layer 20 from bottom on the substrate 50 in which the laminated body 52 is removed. The materials of each layer are made the same as those of each layer common to the laminated body 52. The film thickness of each layer in the laminated body 53 is the same as that each layer common to the laminated body 52. A laminated body of layered structure similarly to the laminated body 53 is also laminated above the lift-off resist layer 51. Sequentially, the lift-off resist layer 51 is removed.

After the laminated body 53 is formed, the exchange coupling magnetic field (Hex) is arisen between the antiferromagnetic layer 16 and the fixed layer 17 constituting the laminated bodies 52 and 53 by performing the heat treatment process in a magnetic field. In this manner, the fixed layer 17 of the laminated body 52 and the first magnetic layer 17 of the laminated body 53 are all magnetized in the same fixed direction. The heat treatment can be performed at a different time. The heat treatment process need only be performed before a process representing FIG. 13 in which each element is cut out from the substrate 50. Since the heat treatment process in a magnetic field is performed on all the laminated bodies 52 and 53 formed on the substrate 50, the heat treatment process in a magnetic field can be easily performed.

Figure 11:
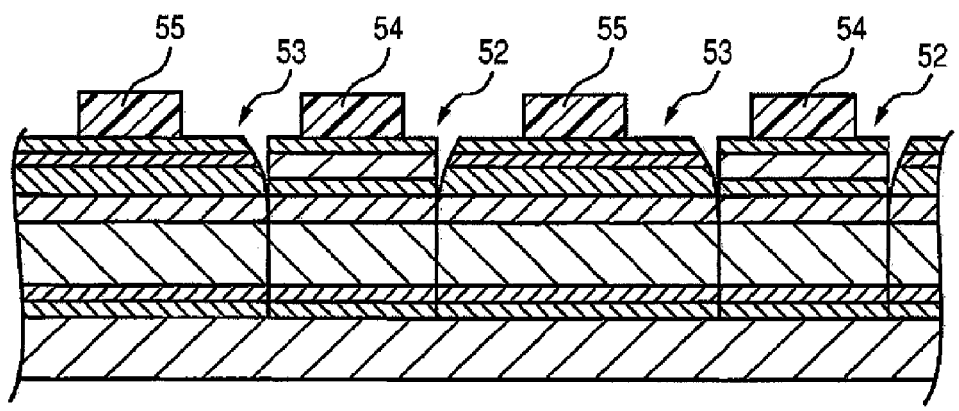
FIG. 11 is a process diagram illustrating processes performed after the processes illustrated in FIG. 10.

In a process represented in FIG. 11, a resist layer 54 with a pattern of the magneto-resistive element 8 is provided on the laminated body 52, and a resist layer 55 with a pattern of the fixed resistor 9 is provided on the laminated body 53. The patterns of the resist layers 54 and 55 are formed by the exposure and development processes.

Figure 12:
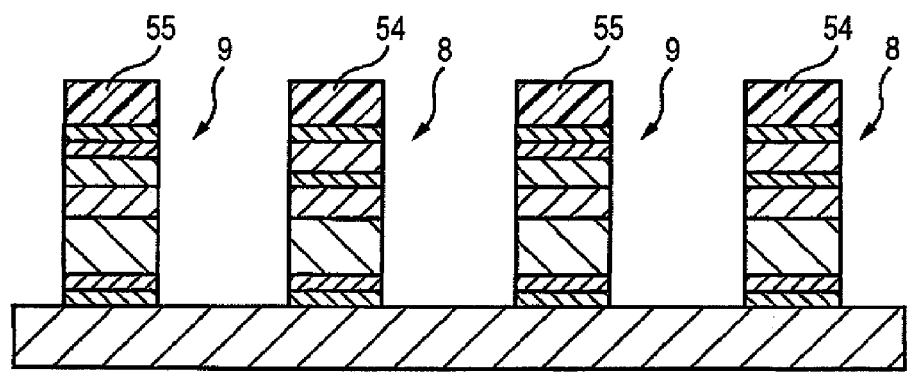
FIG. 12 is a process diagram illustrating processes performed after the processes illustrated in FIG. 11.

When a part of the laminated bodies 52 and 53 without covering of the resist layers 54 and 55 are removed in a process represented in FIG. 12, the left laminated body 52 and the left laminated body 53 serve as the magneto-resistive element 8 and the fixed resistor 9, respectively.

Figure 13:
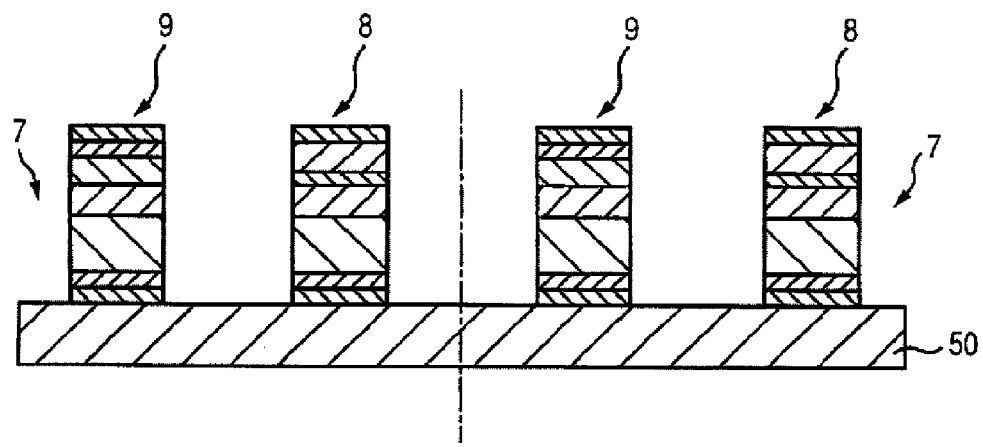
FIG. 13 is a process diagram illustrating processes performed after the processes illustrated in FIG. 12.
Figure 14:
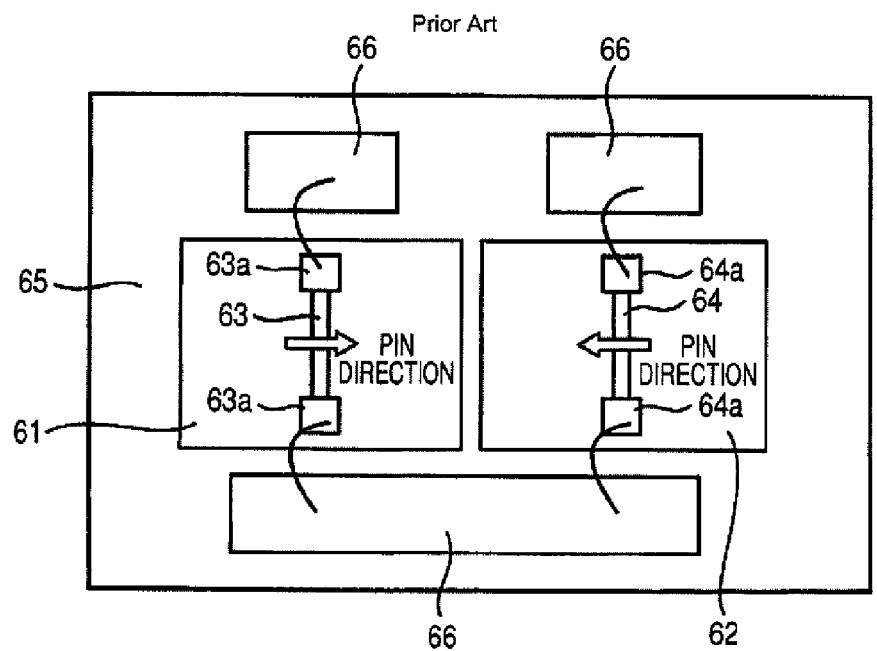
FIG. 14 is a partially top plan view of a magnetic sensor known in the art.

Additionally, in a process represented in FIG. 13, each element base 7 is cut out from the substrate 50 (where each element base 7 is cut along the dashed-dotted line shown in FIG. 13). In this manner, a plurality of magnetic sensors 4 can be obtained from the substrate 50.

For example, since the layers from bottom to the fixed layer 17 are common in the magneto-resistive element 8 and the fixed resistance 9, the layers from bottom to the fixed layer 17 are formed on the entire surface of the substrate 50, and then parts in which the fixed resistor 9 is formed are covered with the resist layer and the like. Sequentially, the non-magnetic layer 18, the free layer 19, and the protection layer 20 constituting the magneto-resistive element 8 are sequentially laminated on a part of the fixed layer 17 out of the covered part with the resist layer, before the resist layer is removed. The resist layer is covered on the magneto-resistive element 8, the magnetic layer 19, the non-magnetic layer 18, and the protection layer 20 constituting the fixed resistor 9 are sequentially laminated on the fixed layer 17 on which the resist layer is not covered, and the resist layer is removed similarly to the processes after FIG. 11. The above described method can also form the magneto-resistive element 8 and the fixed resistor 9 on the substrate 50, but after the fixed layer 17 is formed, the magneto-resistive element 8 and the fixed resistor 9 suffer from excessive exposure to the atmosphere in order to provide the resist layer, thereby degrading the fixed layer 17. Accordingly, as shown in FIGS. 8 to 10, it is preferable that the laminated body 52 constituting the magneto-resistive element 8 and the laminated body 53 constituting the fixed resistor 9 each are laminated such that degradation of the layers can be prevented.

According to the embodiment, the magnet 5 is not included as the constituent of the magnetic sensor 4, but can be included as the constituent of the magnetic sensor 4.

Additionally, according to the embodiment, the magneto-resistive element 8 is sequentially formed of the antiferromagnetic layer 16, the fixed layer 17, the non-magnetic layer 18, and the free layer 19 from the bottom surface, but can be sequentially formed of the free layer 19, the non-magnetic layer 18, the fixed layer 17, and the antiferromagnetic layer 16. In his case, the fixed resistor 9 can be sequentially formed as shown in FIG. 4 and can be sequentially formed of the non-magnetic layer 18, the free layer 19, the fixed layer 17, and the antiferromagnetic layer 16. The underlying layer 14 and the seed layer 15 shown in FIG. 4 are optionally formed and are not necessarily provided.

Further, the magnetic sensor 4 according to the embodiment is used for detecting the open and closed states of the foldable cellular phone 1, but can be also used for detecting the open and closed states of the game console. The magnetic sensor 4 shown in FIG. 1 outputs an ON/OFF signal on the basis of magnitude of the exterior magnetic field 4 from the magnet 5, but can also output the ON/OFF signal on the basis of variation of polarity of the magnet 5, or the magnetic sensor 4 can be used as a sensor for detecting a rotational angle such as a throttle position sensor or a geomagnetic sensor (direction sensor).

What is claimed is:

1. A magnetic sensor comprising;
at least one magneto-resistive element; and
at least one fixed resistor,
wherein the magneto-resistive element and the fixed resistor all have an antiferromagnetic layer, a plurality of magnetic layers, a non-magnetic layer, and a protection layer serving as the uppermost layer;
wherein the magneto-resistive element is provided with a fixed layer that has at least one magnetic layer and a magnetization direction thereof is fixed in one direction, and a magneto-sensitive layer which has the remaining magnetic layers and the magnetization direction thereof varies in accordance with an exterior magnetic field, the non-magnetic layer being interposed between the fixed layer and the magneto-sensitive layer, and the antiferromagnetic layer being formed in contact with a surface opposite to the surface where the non-magnetic of the fixed layer is formed; and
wherein in the fixed resistor, at least one magnetic layer is formed in contact with the antiferromagnetic layer, and the magnetization directions of all the magnetic layers are fixed in one direction.

2. The magnetic sensor according to claim 1, wherein a first magnetic layer corresponding to the fixed layer and a second magnetic layer corresponding to a free layer are laminated on the fixed resistor, and the antiferromagnetic layer is formed in contact with the laminated magnetic layers to fix the magnetization directions of the laminated magnetic layers in one direction.

3. The magnetic sensor according to claim 2, wherein the first magnetic layer is formed in contact with the antiferromagnetic layer, and the second magnetic layer and the non-magnetic layer are reversely laminated on each other in a manner different from the magneto-resistive element, and the second magnetic layer is formed in contact with a surface opposite to the surface where the antiferromagnetic layer of the first magnetic layer is formed, thereby fixing the magnetization direction of the second magnetic layer to the same direction as the first magnetic layer.

4. The magnetic sensor according to claim 1, wherein the magneto-resistive element and the fixed resistor are formed on the same element base.

5. The magnetic sensor according to claim 1, wherein the magneto-resistive element and the fixed resistor have the same layer configuration.

* * * * *